United States Patent
Yeo

(10) Patent No.: US 8,373,958 B2
(45) Date of Patent: Feb. 12, 2013

(54) COMBINED POWER METER AND OUTLET DEVICE

(76) Inventor: Un Nam Yeo, Uiwang-si (KR)

( * ) Notice: Subject to any disclaimer, the term of this patent is extended or adjusted under 35 U.S.C. 154(b) by 33 days.

(21) Appl. No.: 12/995,184

(22) PCT Filed: May 27, 2009

(86) PCT No.: PCT/KR2009/002790
§ 371 (c)(1),
(2), (4) Date: Feb. 28, 2011

(87) PCT Pub. No.: WO2009/145553
PCT Pub. Date: Dec. 3, 2009

(65) Prior Publication Data
US 2011/0267729 A1     Nov. 3, 2011

(30) Foreign Application Priority Data

May 28, 2008  (KR) .................... 20-2008-0007001 U

(51) Int. Cl.
*H02H 3/08*  (2006.01)
*H02H 9/02*  (2006.01)
*H02H 3/00*  (2006.01)
(52) U.S. Cl. ........................................ 361/93.1; 361/87
(58) Field of Classification Search ................ 361/93.1, 361/87
See application file for complete search history.

(56) References Cited

U.S. PATENT DOCUMENTS

| 4,101,878 A * | 7/1978 | Shimizu et al. ............... 307/140 |
| 6,476,729 B1 * | 11/2002 | Liu ........................... 340/870.11 |
| 2010/0079001 A1 * | 4/2010 | Lee et al. ........................ 307/40 |

FOREIGN PATENT DOCUMENTS

| JP | 02-155439 | 6/1990 |
| KR | 10-300790 | 11/1998 |
| KR | 10-0701990 | 3/2007 |
| KR | 10-0798830 | 1/2008 |

OTHER PUBLICATIONS

International Search Report for PCT/KR2009/002790 mailed Dec. 30, 2009.

* cited by examiner

*Primary Examiner* — Dharti Patel
(74) *Attorney, Agent, or Firm* — Christopher Paul Mitchell

(57) ABSTRACT

An receptacle device with power-meter is provided. The receptacle device includes a power supply conversion unit configured to convert input power supply so as to measure a current value or a voltage value of the input power supply; an analog-to-digital conversion unit configured to convert an analog output from the power supply conversion unit into a digital signal, a control unit configured to output a control signal to control operation of the receptacle device by comparing the digital signal input from the analog-to-digital conversion unit to a predefined reference value; a switch unit configured to be turned on or off in response to the control signal from the control unit; and a display unit configured to display values of current, voltage, power, zero phase, and power factor of the input power supply, and display a menu that is controllable by a user.

8 Claims, 2 Drawing Sheets

COMBINED POWER METER AND OUTLET DEVICE

RELATED APPLICATION

This application is a 371 application of International Application No. PCT/KR2009/002790, filed May 27, 2009, which in turn claims priority from Korean Patent Application No. 20-2008-0007001, filed May 28, 2008, each of which is incorporated herein by reference in its entirety.

BACKGROUND

1. Field

The following description relates to a receptacle, and more particularly, to a receptacle device to provide power supply transferred through a main receptacle to an electrical device and have both a function of shutting off standby power flowing into the receptacle device through the main receptacle socket from the electric device, which is powered off, so as to protect the receptacle device and a function as a power-meter for monitoring the power.

2. Description of the Related Art

An receptacle device is to receive power supply from a main receptacle and provide the received power to an electrical device, which may be any type of device, for example, a washing machine, a TV, an audio system, a computer, and an air cleaner. The main receptacle may refer to a device installed on a wall to provide power, and the receptacle device is such a device as a power strip or a multi-tap.

When the electrical device is powered off, which is connected to the receptacle device, the standby power is continuously consumed, and thus to prevent such waste, a cable of the electrical device needs to be plugged out from the receptacle device, or the power supply itself that is provided to the receptacle device must be cut off.

However, since it is rather inconvenient, at home or office, to cut off the power supply at every occasion that the electrical device is turned off, the electrical device is usually turned on and off only through control of the power of the electrical device itself while the electrical device is still kept connected to the receptacle device even when it is well aware that the standby power is constantly consumed.

Moreover, a general receptacle device may have a difficulty to efficiently shut off the standby power to each of multiple electrical devices which are plugged in the receptacle device since some of the plugged-in electrical devices are in use and the others are not in use.

Furthermore, the general receptacle device is usually placed under a desk where the electrical device is located, or behind the electrical device, resulting in inconvenience of maintenance.

SUMMARY

The following description relates to a receptacle device with power-meter which prevents the standby power from being consumed in an electrical device and the receptacle device by disconnecting a connection between the receptacle device and a main receptacle when the electrical device is powered off, and at the same time monitors the power for power saving.

In one general aspect, there is provided an receptacle device with power-meter; the receptacle device including: a power supply conversion unit configured to convert input power supply so as to measure a current value or a voltage value of the input power supply; an analog-to-digital conversion unit configured to convert an analog output from the power supply conversion unit into a digital signal; a control unit configured to output a control signal to control operation of the receptacle device by comparing the digital signal input from the analog-to-digital conversion unit to a predefined reference value; a switch unit configured to be turned on or off in response to the control signal from the control unit; and a display unit configured to display values of current, voltage, power, zero phase, and power factor of the input power supply, and display a menu that is controllable by a user.

The power supply conversion unit may be further configured to include a current conversion unit configured to primarily convert a current value of the input power supply into primary voltage so as to measure the current of the input power supply, and a voltage conversion unit configured to convert voltage of the input power supply into secondary voltage so as to measure the voltage of the input power supply.

The control unit may be further configured to calculate and measure current, voltage, power factor, zero phase, over voltage, and over current based on current values and voltage values of currently input power supply and an electrical device connected to the receptacle device, and control the display unit to display the calculated and measured results.

The predefined reference value may include an overload reference value and a minimum reference value, and the control unit is further configured to monitor current use of an electrical device connected to the receptacle device, and if the current use is greater than the overload reference value, control the switch unit to cut off power supply.

The control unit may be further configured to monitor current use of the electrical device connected to the receptacle device, and if the current use is smaller than the minimum reference value, shut off the switch unit.

The receptacle device may further include a key input unit configured to receive an instruction from a user to control settings of the control unit.

The receptacle device may further include a timer configured to provide a clock signal to the control unit.

The receptacle device may further include a remote controller configured to control the control unit in remote using either wired or wireless communication scheme.

The wired communication scheme may be in accordance with one of RS232, RS422, and RS485 standards, and the wireless communication scheme may use one of infrared communication, radio frequency (RF) communication, Bluetooth communication, and ZigBee communication.

The remote controller may be further configured to include a remote key input unit configured to receive an instruction from a user to control settings of the control unit, and a remote display unit configured to display values of the current, the voltage, the power, the zero phase, and the power factor of the input power supply and display a menu that is controllable by the user.

Other features and aspects may be apparent from the following detailed description, the drawings, and the claims.

Figure 1:
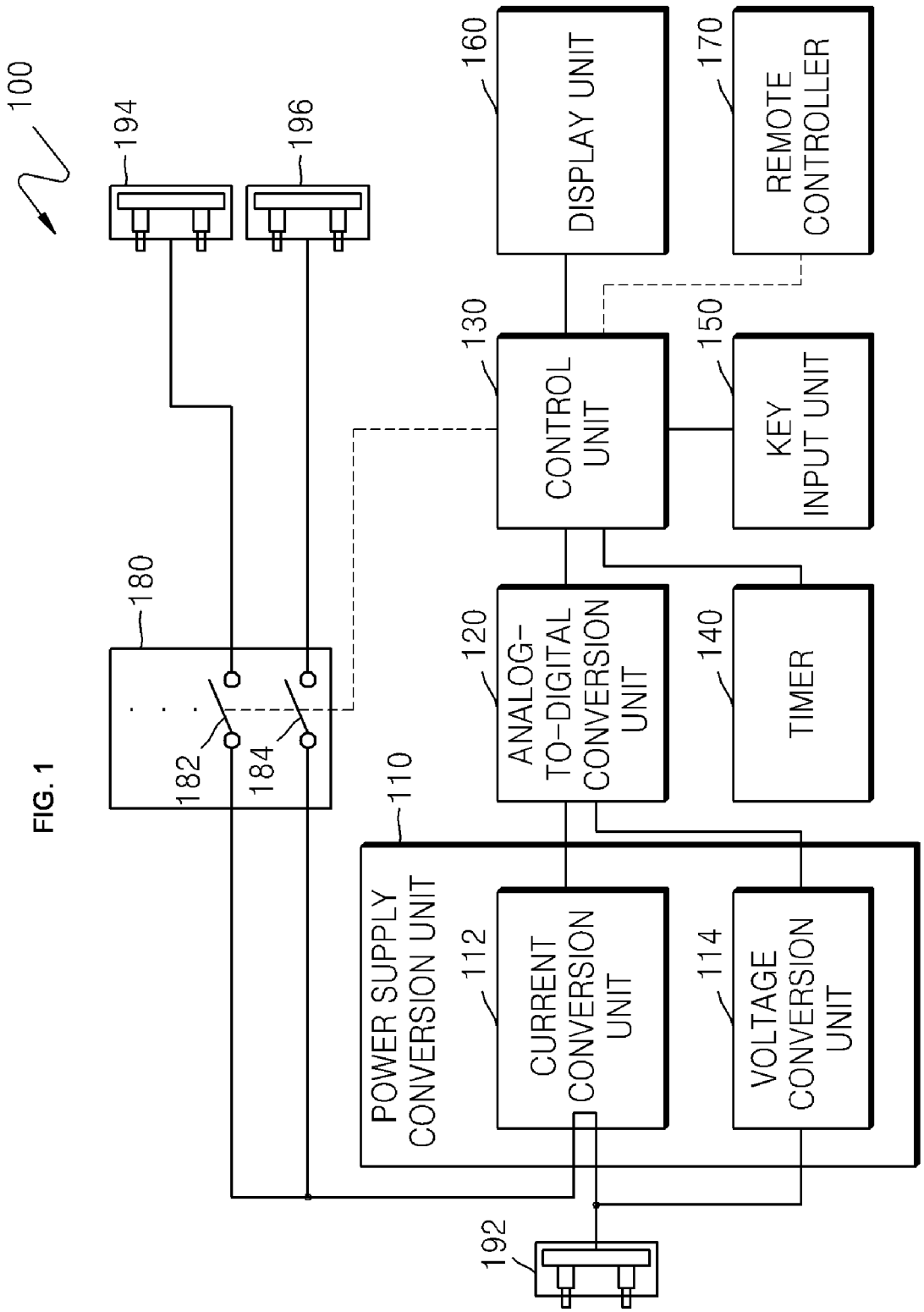
FIG. 1 is a diagram illustrating an example of a configuration of a receptacle device with power-meter.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

FIG. 1 illustrates an example of a configuration of a receptacle device with power-meter. Referring to the example illustrated in FIG. 1, the receptacle device 100 may include a power supply conversion unit 110, an analog-to-digital conversion unit 120, a control unit 130, a display unit 160, and a switch unit 180.

The power supply conversion unit 110 may convert power supply input through a plug 192 to measure a current value or a voltage value of the input power supply. In this example, the input power supply is alternating current (AC).

The power supply conversion unit 110 may include a current conversion unit 112 and a voltage conversion unit 114.

The current conversion unit 112 may convert current of the input power supply into primary voltage so as to measure the current value of the input power supply.

The voltage conversion unit 114 may convert voltage of the input power supply into secondary voltage so as to measure the voltage value of the input power. The secondary voltage may be generated by lowering the voltage value of the input power, and hence it is smaller than the initial voltage value of the input power. The primary voltage value and the secondary voltage value are required for the control unit 130 to perform various operations, which will be described later.

The analog-to-digital conversion unit 120 may convert an analog output from the power supply conversion unit 110 into a digital signal. Since the primary voltage and the secondary voltage output from the power supply conversion unit 110 are analog values, these values are converted into digital signals to be operated by the control unit 130.

The control unit 130 may compare the digital signal input from the analog-to-digital conversion unit 120 to a predefined reference value to output a reference signal for controlling the operation of the receptacle device 100.

The control unit 130 may control the receptacle device 100 and perform operations on the receptacle device 100. For example, the control unit 130 may protect a load by calculating and measuring current, voltage, power factor, zero phase, over voltage, over current, and the like based on current values and voltage values of currently input power supply and connected electrical devices, and may measure standby power of the connected electrical device, and if the measured standby power value is equal to or smaller than a predefined value, shut off the output.

In addition, the control unit 130 may be connected to the display unit 160, a remote controller 170, a key input unit 150, and a timer 140, which will be described later, to control the overall operation of these elements.

In this case, the predefined reference value may be initially set, or be defined later by a user. The predefined reference value may include an overload reference value and a minimum reference value.

The control unit 130 may monitor current use of the electrical device and, if the current use is greater than the overload reference value, control the switch unit 180 to cut off the power supply.

Additionally, the control unit 130 may monitor current use of the electrical device and, if the current use is smaller than the minimum reference value, turn off the switch unit 180 to prevent unnecessary consumption of standby power since the current use smaller than the minimum reference value indicates that the electrical device is powered off.

Furthermore, the control unit 130 may resume supplying power to the electrical device by automatically turning on the switch unit 180 when the cause of overload is removed after a given period of time has elapsed since the switch unit 180 was shut off due to the overload.

The display unit 160 may display values of current, voltage, power and, power factor of the input power supply, and also display a menu that is controllable by the user. The display unit 160 may use a crystal liquid display device.

The switch unit 180 may be turned on or off in response to a control signal from the control unit 130. Although in the example illustrated in FIG. 1, the switch unit 180 is illustrated as having only two switches 182 and 184 since the receptacle device 100 shown in the example has only two sockets 194 and 196, the number of switches is not limited thereto and any number is of switches may be provided.

The receptacle device 100 with power-meter may further include the timer 140 that provides a clock signal to the control unit 130. The timer 140 may provide an accurate time indication, thereby facilitating schedule management.

Moreover, the receptacle device 100 may further include the key input unit 150 that receives an instruction from the user. The user may set and control various settings of the receptacle device 100 through the key input unit 150.

The receptacle device 100 may further include the remote controller 170 that controls the control unit 130. The remote controller 170 may be connected to the control unit 130 through wired or wireless communication.

Figure 3:
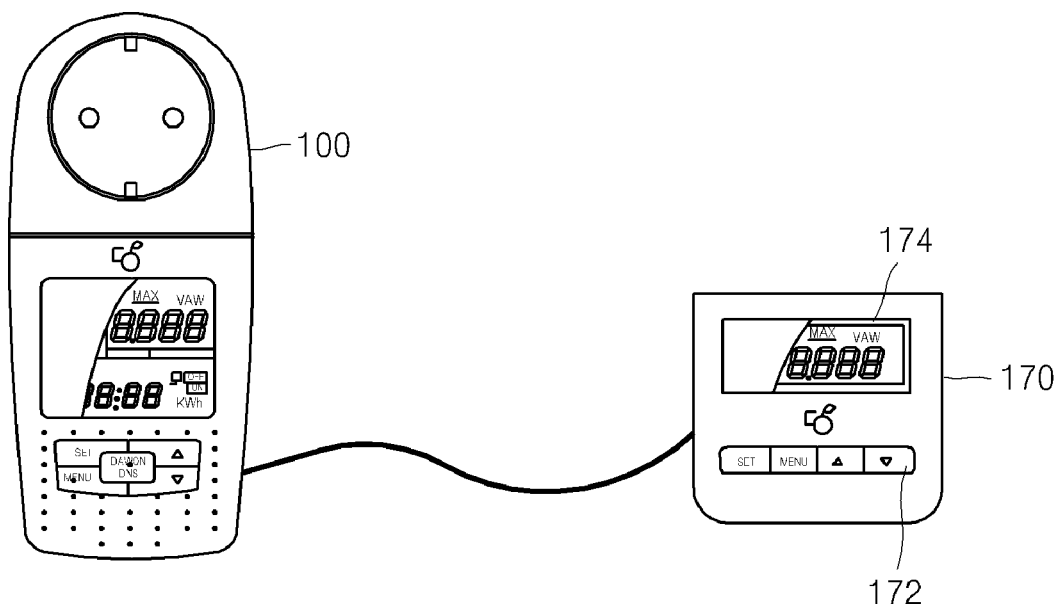
FIG. 3 is a diagram illustrating an example of the remote controller connected to the receptacle device as shown in the example illustrated in FIG. 1.

FIG. 3 illustrates an example of the remote controller connected to the receptacle device as shown in the example illustrated in FIG. 1.

The remote controller 170 may be connected to the receptacle device 100 in a wired manner, allowing the control of the control unit in remote. In this case, wired communication may be in accordance with RS232, RS422, or RS485 standards. However, the wired communication is not limited to the above, and various wired communication standards may be used.

In addition, the remote controller 170 may control the control unit 130 in remote through a wireless communication with the control unit 130. The remote controller 170 may control the control unit 130 in remote through wireless communication, for example, infrared communication, radio frequency (RF) communication, Bluetooth communication, and ZigBee communication. However, the wireless communication scheme is not limited to the described above, various wireless communication schemes may be used.

As shown in the example illustrated in FIG. 3, the remote controller 170 may include a is remote key input unit 172 and a remote display unit 174 to control the control unit 130.

The remote key input unit 172 may has a function the same as the key input unit 150, as shown in the example illustrated in FIG. 1, which receives an instruction from the user. The user may set and control various settings of the receptacle device 100 through the remote key input unit 172.

The remote display unit 174 may display values of current, voltage, power and, power factor of the power supply input to the receptacle device 100, and also display a menu that is controllable by the user. The remote display unit 174 may be a crystal liquid display device.

Figure 2:
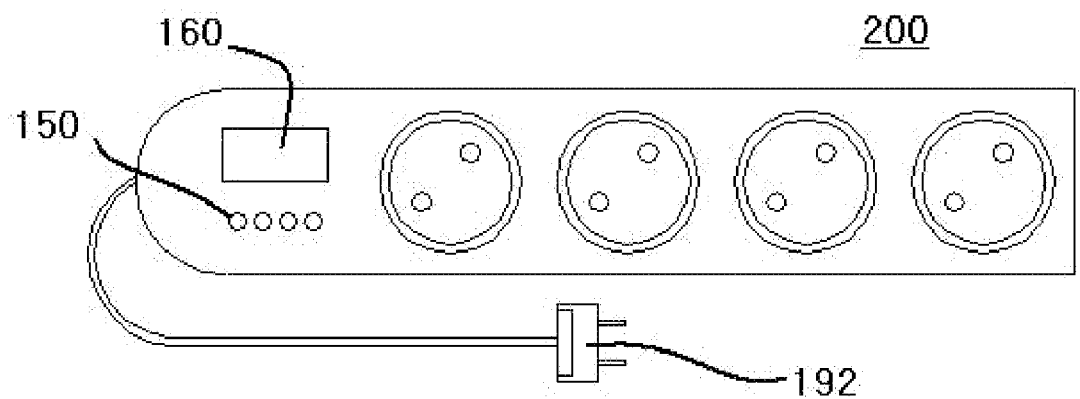
FIG. 2 is a diagram illustrating an example of the receptacle device shown in FIG. 1.

FIG. 2 illustrates an example of the receptacle device shown in FIG. 1. Referring to the example illustrated in FIG. 2, the receptacle deice 200 with power-meter may include plug sockets into which electrical devices are plugged, have electrical elements having the configuration, as shown in the example illustrated in FIG. 1, embedded therein, and include the display unit 160 and the key input unit 150 externally. The example illustrated in FIG. 2 is provided as an exemplary embodiment of the receptacle device, and the receptacle device 200 may include only one plug socket or vary in shape.

Furthermore, when the receptacle device described above is equipped to a main receptacle on a wall, the main receptacle may be enabled to function as power-meter.

As described above, when an electrical device connected to the receptacle device is powered off, the receptacle device with power-meter shuts off the connection to the main receptacle by relay, so that standby power from the main receptacle to the receptacle device can be cut off. Accordingly, impact or noise produced in the main receptacle may not be transferred to the receptacle device, and thus the receptacle device and the electrical device can be prevented from damage.

In addition, since the user can monitor and control use of current, voltage, power, power factor, and the like, the receptacle device is more advantageous to save energy.

Furthermore, remote monitoring and controlling of current, voltage, power, power factor, and the like can be realized.

The receptacle device described above may be applicable to manufacturing power-meters and receptacles.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An receptacle device with power-meter; the receptacle device comprising:
 a power supply conversion unit configured to convert input power supply so as to measure a current value or a voltage value of the input power supply;
 an analog-to-digital conversion unit configured to convert an analog output from the power supply conversion unit into a digital signal;
 a control unit configured to output a control signal to control operation of the receptacle device by comparing the digital signal input from the analog-to-digital conversion unit to a predefined reference value;
 a switch unit configured to be turned on or off in response to the control signal from the control unit; and
 a display unit configured to display values of current, voltage, power, zero phase, and power factor of the input power supply, and display a menu that is controllable by a user,
 wherein the predefined reference value includes an overload reference value and a minimum reference value, and the control unit is further configured to monitor current use of an electrical device connected to the receptacle device, and if the current use is greater than the overload reference value, control the switch unit to cut off power supply, and
 wherein the control unit is further configured to monitor current use of the electrical device connected to the receptacle device, and if the current use is smaller than the minimum reference value, shut off the switch unit.

2. The receptacle device of claim 1, wherein the power supply conversion unit is further configured to comprise
 a current conversion unit configured to primarily convert a current value of the input power supply into primary voltage so as to measure the current of the input power supply, and a voltage conversion unit configured to convert voltage of the input power supply into secondary voltage so as to measure the voltage of the input power supply.

3. The receptacle device of claim 1, wherein the control unit is further configured to calculate and measure current, voltage, power factor, zero phase, over voltage, and over current based on current values and voltage values of currently input power supply and an electrical device connected to the receptacle device, and control the display unit to display the calculated and measured results.

4. The receptacle device of claim 1, further comprising:
 a key input unit configured to receive an instruction from a user to control settings of the control unit.

5. The receptacle device of claim 1, further comprising:
 a timer configured to provide a clock signal to the control unit.

6. The receptacle device of claim 1, further comprising:
 a remote controller configured to control the control unit in remote using either wired or wireless communication scheme.

7. The receptacle device of claim 6, wherein the wired communication scheme is in accordance with one of RS232, RS422, and RS5485 standards, and the wireless communication scheme uses one of infrared communication, radio frequency (RF) communication, Bluetooth communication, and ZigBee communication.

8. The receptacle device of claim 6, wherein the remote controller is further configured to comprise
 a remote key input unit configured to receive an instruction from a user to control settings of the control unit, and
 a remote display unit configured to display values of the current, the voltage, the power, the zero phase, and the power factor of the input power supply and display a menu that is controllable by the user.

* * * * *